(12) United States Patent
Keil

(10) Patent No.: US 7,126,382 B2
(45) Date of Patent: Oct. 24, 2006

(54) LOWER POWER HIGH SPEED DESIGN IN BICMOS PROCESSES

(75) Inventor: Ulrich Dieter Felix Keil, Bronshoj (DK)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 10/651,245

(22) Filed: Aug. 29, 2003

(65) Prior Publication Data

US 2005/0046444 A1 Mar. 3, 2005

(51) Int. Cl.
*H03K 19/094* (2006.01)

(52) U.S. Cl. .................... 326/110; 326/109; 326/115

(58) Field of Classification Search .............. 326/110, 326/115, 126, 127, 64, 84, 104–105, 109
See application file for complete search history.

(56) References Cited

U.S. PATENT DOCUMENTS

| | | | |
|---|---|---|---|
| 5,283,479 A * | 2/1994 | Rosseel et al. ............ 326/104 |
| 5,298,810 A * | 3/1994 | Scott et al. .................... 326/66 |
| 5,304,869 A | 4/1994 | Greason ...................... 307/446 |
| 5,420,529 A * | 5/1995 | Guay et al. .................. 326/115 |
| 5,990,718 A * | 11/1999 | Tchamov et al. ........... 327/227 |
| 6,433,595 B1 * | 8/2002 | Tung et al. .................. 327/115 |

OTHER PUBLICATIONS

Paul R. Gray et al., "Single-Transistor and Multiple-Transistor Amplifiers, Multiple-Transistor Amplifier Stages," Analysis and Design of Analog Integrated Circuits, Fourth Edition, pp. 206-211.
Michael M. Green et al., "Design of CMOS CML Circuits for High-Speed Broadband Communications," IEEE 2003, pp. II-204-II-207.
H.-M. Rein et al., "Design Considerations for Very-High-Speed Si-Bipolar IC's Operating up to 50 Gb/s," IEEE Journal of Solid-State Circuits, vol. 31, No. 8, Aug. 1996, pp. 1076-1090.

* cited by examiner

*Primary Examiner*—Vibol Tan
(74) *Attorney, Agent, or Firm*—Fleshner & Kim, LLP

(57) ABSTRACT

A low power high-speed design for integrated circuits using BiCMOS processes is disclosed. The design uses a first stage including bipolar transistor pairs configured as inputs and drivers for an output. A second CMOS stage is coupled to the first stage in a series-gated configuration and receives clock or data inputs. A third stage is coupled to the second stage and is configured as a current source. The combination results in circuits that can operate at conventional supply voltages of 1.8 volts.

35 Claims, 19 Drawing Sheets

LOWER POWER HIGH SPEED DESIGN IN BICMOS PROCESSES

BACKGROUND OF THE INVENTION

1. Field of the Invention

Embodiments of the present invention relate to integrated circuits. In particular, embodiments of the present invention relate to low power high-speed designs for logic circuits using BiCMOS processes.

2. Background of the Related Art

FIG. 1 illustrates a related art flip-flop design using bipolar transistors. Those skilled in the art will recognize the circuit, so specific details of the circuit will not be described herein. The flip-flop circuit is used merely to illustrate features of embodiments of the invention. Additionally, the circuit provides a benchmark circuit for evaluating process/circuit performance (e.g., switching frequency, power consumption, maximum data rate, and the like) of various designs.

Referring to FIG. 1, a schematic diagram of a bipolar flip-flop design is illustrated. All transistors are assumed to have similar characteristics. Additionally, all resistors illustrated are 250 Ohm corresponding to a voltage swing of 250 mV with the current source delivering 1 mA. Transistors 110 and 112 form a differential input of the flip-flop and are coupled to inputs D and DN. Transistors 120 and 122 are coupled to differential clock inputs CK and CKN. Finally, transistor 130 is coupled to a current source input VCS and functions as a current source for the input stage. For purposes of illustration, only representative transistors are discussed further in relation to FIG. 2.

FIG. 2 illustrates the voltage drop across each transistor. The power supply is typically 3.3V for the bipolar design. The supply voltage is distributed across the transistors as illustrated. The voltage drop $V_1$ across input stage represented by transistor 110 is approximately 0.95V. This value represents the maximum voltage drop given by Vbe for a silicon bipolar transistor at low temperature. For example, V1=0.95V can be considered typical (for standard technology, minimum temperature specification –30 C) for the worst case (highest voltage and lowest temperature) value. The voltage drop $V_2$ across the clock stage represented by transistor 120 is approximately 0.95V. The voltage drop $V_3$ across the current source stage represented by transistor 130 and resistor R5 is approximately 0.60V. Stacking up voltages $V_1$, $V_2$, and $V_3$ yields a nominal voltage of approximately 2.5V. This voltage represents the minimum supply voltage for the bipolar design.

Referring to FIG. 3, a schematic diagram of a CMOS flip-flop design is illustrated. Once again, all transistors are assumed to have similar characteristics. The resistors in FIG. 3 are 600 Ohm corresponding to a voltage swing of 600 mV at 1 mA. Transistors 310 and 312 form a differential input of the flip-flop and are coupled to inputs D and DN. Transistors 320 and 322 are coupled to differential clock inputs CK and CKN. Finally, transistor 330 is coupled to a current source input VCS and functions as a current source for the input stage. For purposes of illustration, only representative transistors are discussed further in relation to FIG. 4.

FIG. 4 illustrates the voltage drops across each transistor. The power supply can be 1.8V or less for the CMOS design. The supply voltage is distributed across the transistors as illustrated. The voltage drop $V_1$ across the input stage represented by transistor 310 is approximately 0.40V. The voltage drop $V_2$ across the clock stage represented by transistor 320 is approximately 0.20V. The voltage drop $V_3$ across the current source stage represented by transistor 330 is approximately 0.30V. Stacking up voltages $V_1$, $V_2$, and $V_3$ yields a nominal voltage of approximately 0.90V.

FIG. 5 is a schematic diagram of a bipolar latch. All transistors are assumed to have similar characteristics. The power supply is 3.3V for the bipolar design. The supply voltage is distributed across the transistors as illustrated. The voltage across the current source stage represented by transistor 530 is approximately 1.3V at the common node of transistors 520 and 522. The voltage from the common node of transistors 510 and 512 to VEE is 2.3 volts. As can be seen, these voltages would not allow operation at 1.8V.

The foregoing related art circuits use either all bipolar or all CMOS transistors in the respective designs. However, it is known to combine bipolar and complementary CMOS technologies in a single integrated BiCMOS circuit. A circuit that combines bipolar and CMOS technologies can utilize features of each technology to provide enhanced circuit performance.

For example, CMOS circuits have the advantages of extremely low quiescent power consumption, rail-to-rail output capability, high density, and a very high DC input impedance. Bipolar logic circuits, on the other hand, are useful in driving large capacitive loads, have fast switching capabilities, and feature lower internal voltage swings. For example, the internal voltage swing of the bipolar flip-flop of FIG. 1 is 250 mV and the internal voltage swing of the CMOS flip-flop of FIG. 3 is 600 mV.

The related art topology creates problems in regard to the trade-off of power and maximum frequency. For example, all-CMOS designs can operate at lower voltages and power (e.g., 1.8V), but suffer from lower frequency capability. The all-bipolar designs allow for higher frequency operation, but also operate at higher voltages (e.g., 3.3V) and consequently higher power requirements. To try and overcome these problems some BiCMOS high frequency devices use separate 1.8V and 3.3V to supply power to the CMOS logic and bipolar drivers. However, this configuration requires multiple power supplies.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
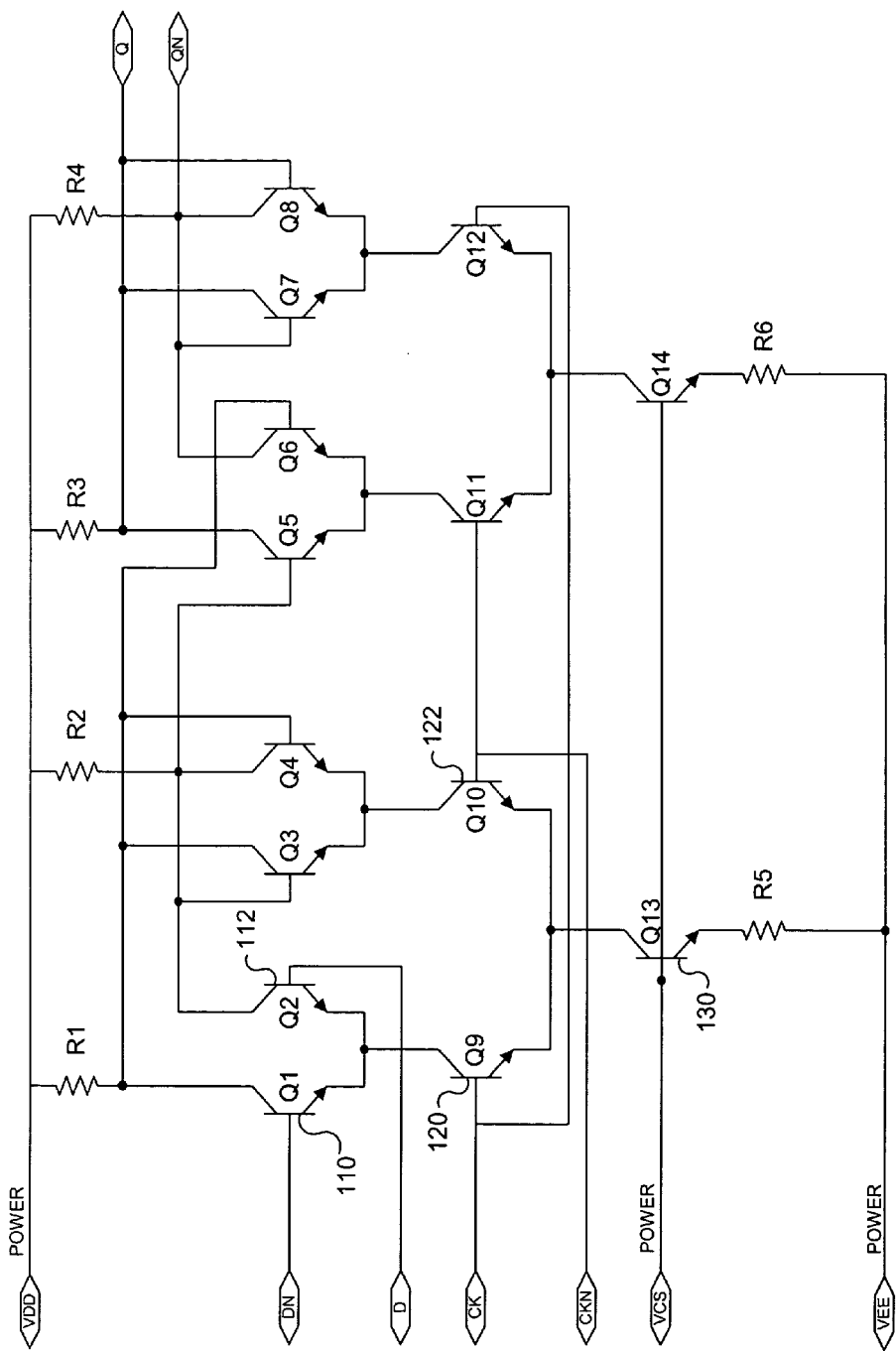
FIG. 1 is a schematic diagram of a related art bipolar toggle flip-flop.
Figure 2:
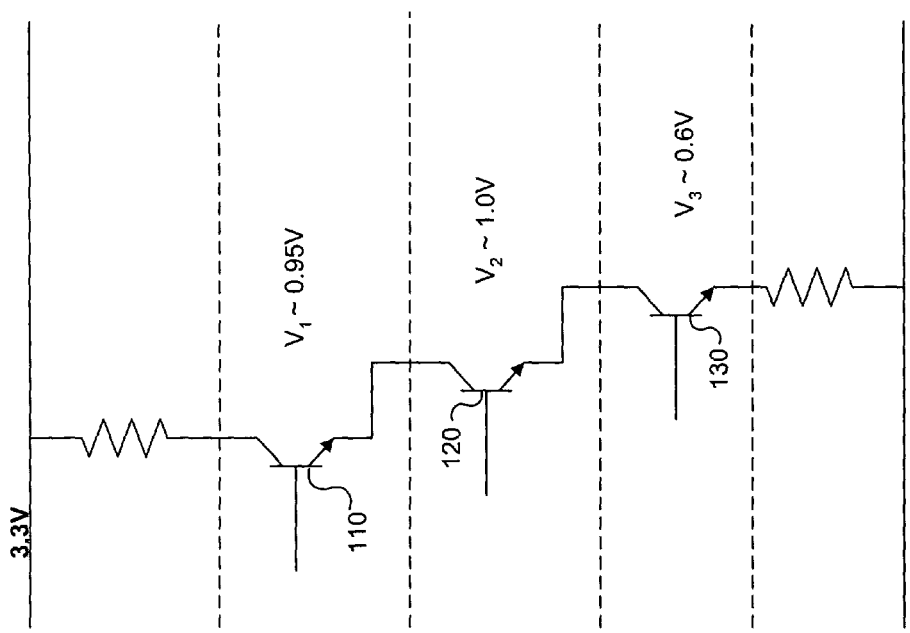
FIG. 2 illustrates the voltage drops across the various transistors in the related art bipolar design.

In the following detailed description of preferred embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments. Accordingly, the following detailed description is not to be taken in a limiting sense, and the scope of the present invention is defined only by appended claims, along with the full scope of equivalence to which such claims are entitled.

Standard voltages in digital logic circuits are typically −5.2, 5.0, 3.3, and 1.8 volts each with +−10% variation. The voltage level tends to linearly determine the power consumption. The related art high-speed bipolar circuits typically operate at a minimum voltage of 3.3V. The related art CMOS circuits typically operate at 1.8V. Accordingly, the bipolar circuits tend to consume more power than the CMOS circuits. However, the CMOS circuits have a lower maximum frequency than the bipolar circuits. The BiCMOS circuits according to embodiments of the present invention allow for a maximum frequency that approaches the bipolar designs. However, the BiCMOS circuits according to embodiments of the present invention can operate at 1.8V, which can reduce power consumption by approximately 40% when compared to the bipolar design. Further, due to standard supply voltage specification of 1.8V +−10% these circuits should be able to operate down to about 1.6V.

Table 1 shows a comparison of simulated maximum toggle frequency and supply voltage for related art bipolar, related art CMOS, and BiCMOS designs according to embodiments of the present invention.

TABLE 1

|  | Bipolar | BiCMOS | CMOS |
| --- | --- | --- | --- |
| Max. Toggle Freq. | 55 GHz | 45 GHz | 20 GHz |
| Supply Voltage | 3.3 V | 1.8 V | 1.8 V |

Those skilled in the art will appreciate that the maximum frequency achievable is also a function of the process technology that generates the circuits. For example, Table 1 illustrates values for a silicon germanium (Si—Ge) process using 90 nm manufacturing technology that can be used for next-generation communications chips.

In contrast, Table 2 illustrates values for a Si—Ge process using 0.25 μm technology (e.g., BiCMOS7 by STMicroelectronics). Although the maximum frequencies are lower in Table 2, the BiCMOS designs according to embodiments of the present invention can improve the performance of the 0.25 μm technology processes. In fact, extending the capabilities of established processes allows for more stable and less expensive processes to be used for a given application (e.g., specific frequency/data rate).

TABLE 2

|  | Bipolar | BiCMOS | CMOS |
| --- | --- | --- | --- |
| Max. Toggle Freq. | 20 GHz | 19 GHz | 7 GHz |
| Supply Voltage | 3.3 V | 1.8 V | 1.8 V |

For example, a 10G serializer/deserializer or multiplexer/demultiplexer (MUX/DEMUX) cannot be produced for 1.8V operation using the BiCMOS7 process and the related art pure CMOS design because the maximum toggle frequency is 7 GHz. However, using BiCMOS designs according to embodiments of the present invention, a 10G serializer/deserializer can be produced having a 1.8V supply voltage using the BiCMOS7 process.

Figure 3:
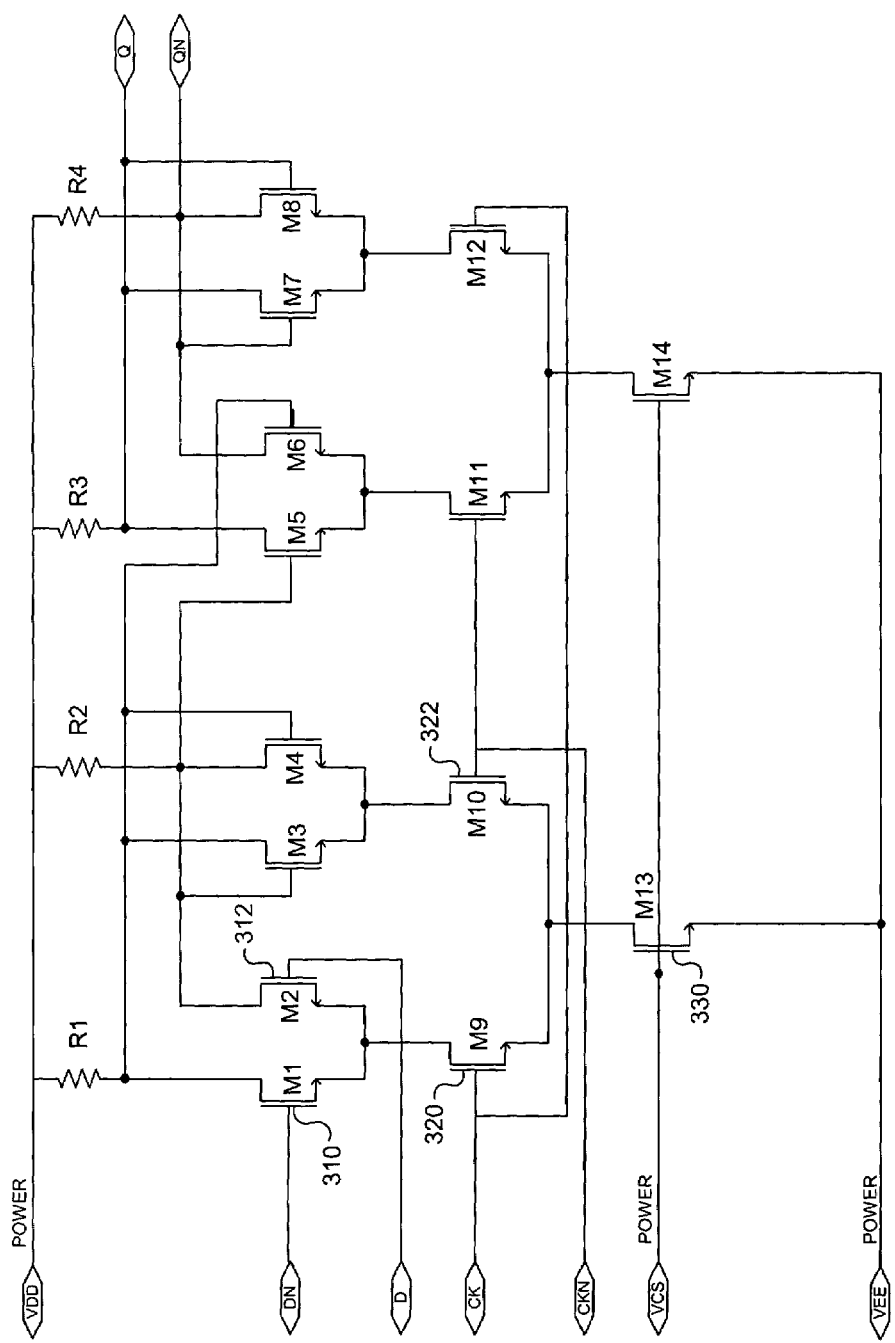
FIG. 3 is a schematic diagram of a related art CMOS toggle flip-flop.
Figure 4:
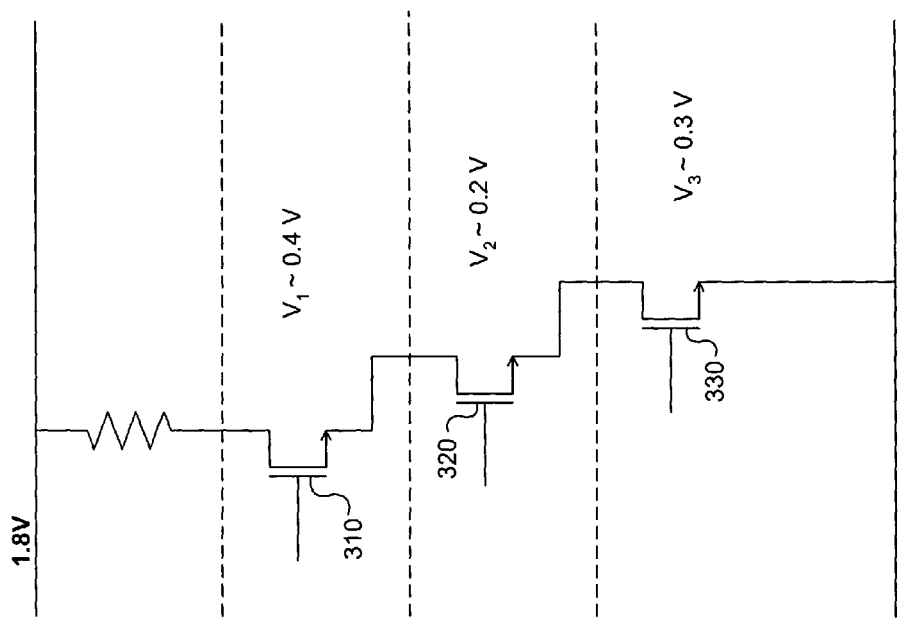
FIG. 4 illustrates the voltage drops across the various transistors in the related art CMOS design.
Figure 6:
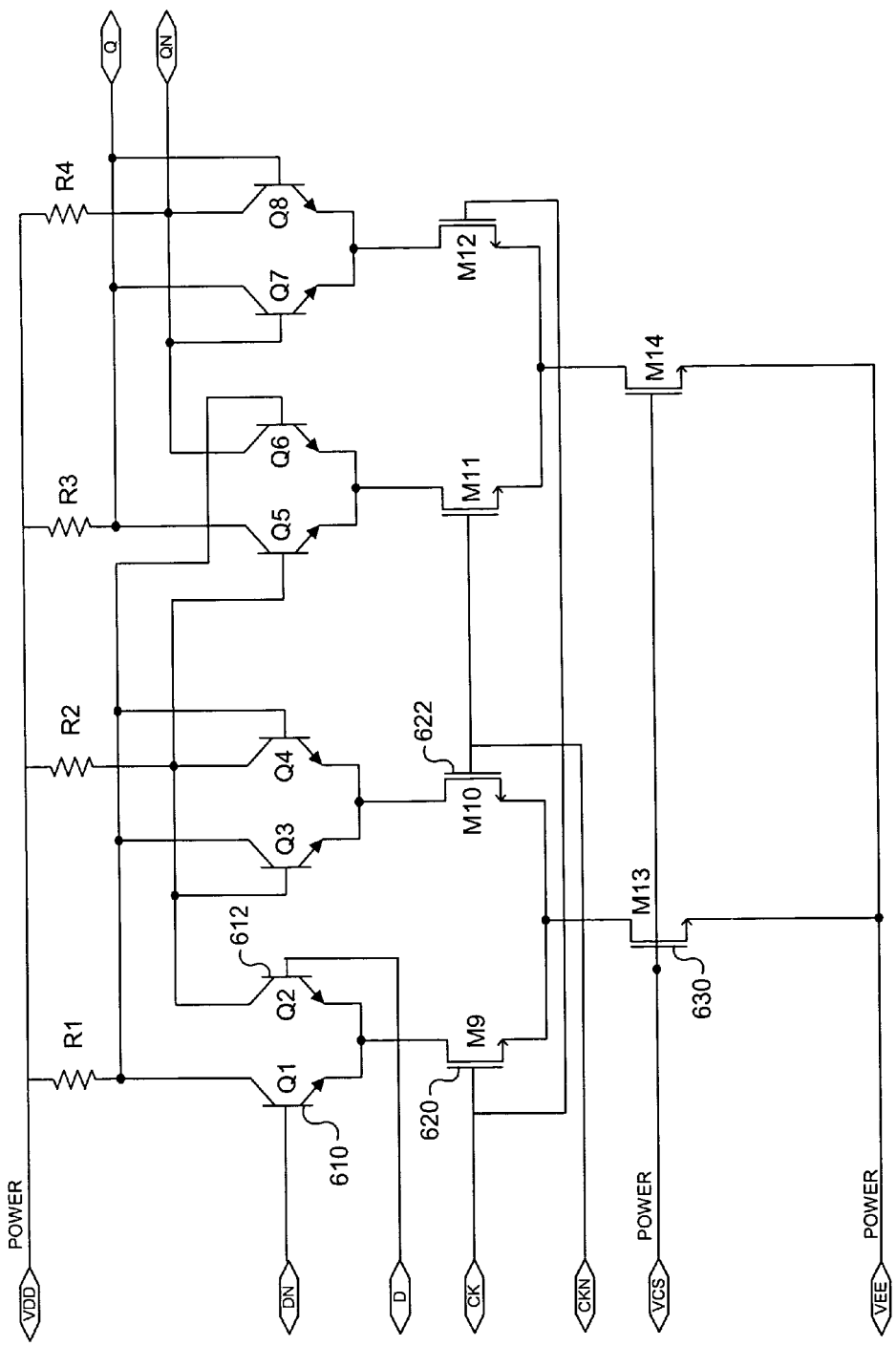
FIG. 6 is a schematic diagram of a BiCMOS toggle flip-flop according to an embodiment of the present invention.

Referring to FIG. 6, a schematic diagram of a BiCMOS flip-flop design according to an embodiment of the present invention is illustrated. When compared to the related art circuits of FIGS. 1 and 3, those skilled in the art will appreciate that the function of the circuit is the same and therefore will not be described in detail herein. Bipolar transistors 610 and 612 form a differential input to the flip-flop and are coupled to inputs D and DN. CMOS Transistors 620 and 622 are coupled to differential clock inputs CK and CKN. Finally, CMOS transistor 630 is coupled to a current source input VCS and functions as a current source. For purposes of illustration, only representative transistors are discussed further in relation to FIG. 7.

Figure 7:
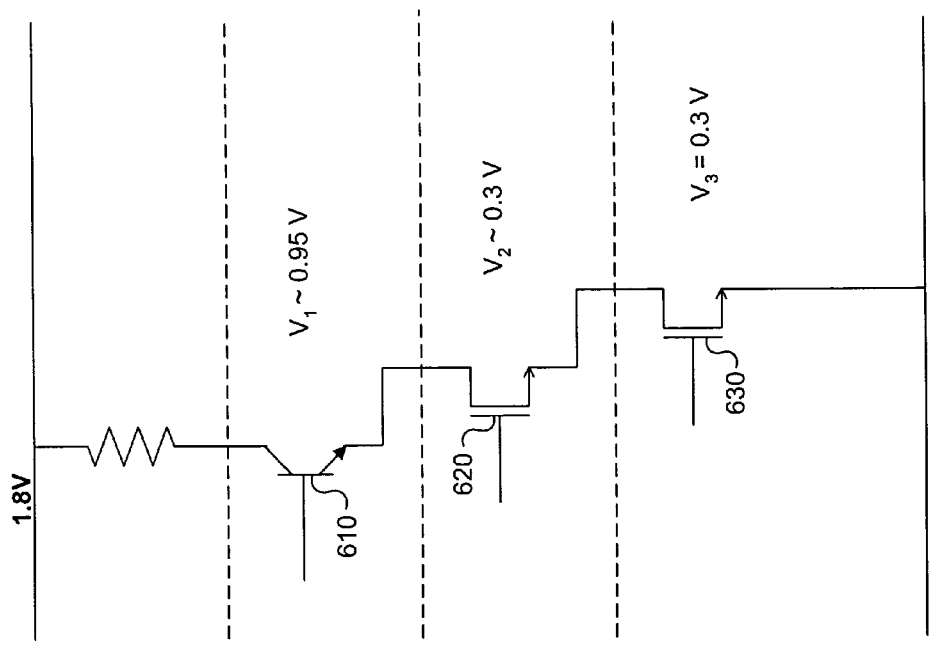
FIG. 7 illustrates the voltage drops across the various transistors in the BiCMOS design.

FIG. 7 illustrates the voltage drops across each transistor. As discussed above, the power supply can be 1.8V for the BiCMOS design. The voltage drop $V_1$ across the input stage represented by transistor 610 is approximately 0.95V. The voltage drop $V_2$ across the clock stage represented by transistor 620 is approximately 0.30V. The voltage drop $V_3$ across the current source transistor 630 is approximately 0.30V. Stacking up voltages $V_1$, $V_2$, and $V_3$ yields a nominal voltage of approximately 1.55V. This voltage enables operation of the circuit at a standard supply voltage specification of 1.8V+/−10%.

The approach illustrated in exemplary embodiments of the present invention is based on current mode logic (CML) architecture. The bipolar transistors are used to drive the termination resistors and the following stages. Due to the high amplification of the bipolar transistors, they are able to drive a higher load and at the same time the driven bipolar stage requires a lower voltage swing (e.g., 250 mV). CMOS transistors can be used for the clock and switch signals (e.g., in multiplexers, flip-flops, latches and the like) and current sources.

As previously noted, CMOS transistors can be used for the clock stage while bipolar transistors are used for sampling the signal and to drive the next stage. The bipolar transistors are dimensioned to operate slightly above maximum $f_T$ at the tail current. The sizing of the CMOS transistors offers more degrees of freedom. The optimum CMOS transistor size is found by weighing power consumption vs. performance trade-offs, as will be appreciated by those skilled in the art. The design considerations include determining the voltage drop $V_{DS}$ to enable operation with 1.62V (for a standard supply of 1.8V +/−10%), which can lead to a high w/l ratio. Additionally, the input capacitance has to be considered. A high input capacitance (scaling with w*l) can require a driving stage that uses an unreasonable amount of power. For example, a w/l ratio for a 90 nm process can be approximately 50 and a w/l ratio for a 0.25 µm process can be approximately 20. Those skilled in the art will recognize these ratios are for illustration and not limitation. Further, the design considerations discussed above are similar design considerations for standard CMOS CML design. In summary, process specific choices depending on threshold voltage of the CMOS transistor (Vt) and minimum gate length should be made for an efficient design.

As discussed above, FIG. 6 illustrates a flip-flop with the bipolar sample and hold stages, which are significantly faster than the related art CMOS design. One reason for the improvement over the CMOS design is the load for the sampling stage Q1/Q2 comprises two buffer stages Q3/Q4 and Q5/Q6, which constitute a much smaller capacitive load. The linearized large signal input capacitance of a bipolar buffer stage with a tail current of $I_{CS}$=1 mA, $Z_{out}$=250 Ω, is approximately 15 fF. In contrast, the input capacitance of an equivalent CMOS stage approaches 100 fF for $I_{CS}$=1 mA, $Z_{out}$=600 Ω and 240 fF for $I_{CS}$=2.4 mA and $Z_{out}$=250 Ω.

Further, a second order effect is given by the Cascode effect. Due to the exponential current-voltage (I-V) relation in bipolar transistors, the voltage is kept relatively constant at the drain of the clock transistors when compared to a related art CMOS sampling stage. Therefore, the clock transistors experience a smaller load resistance than with a CMOS sampling stage illustrated in the foregoing related art designs.

Figure 5:
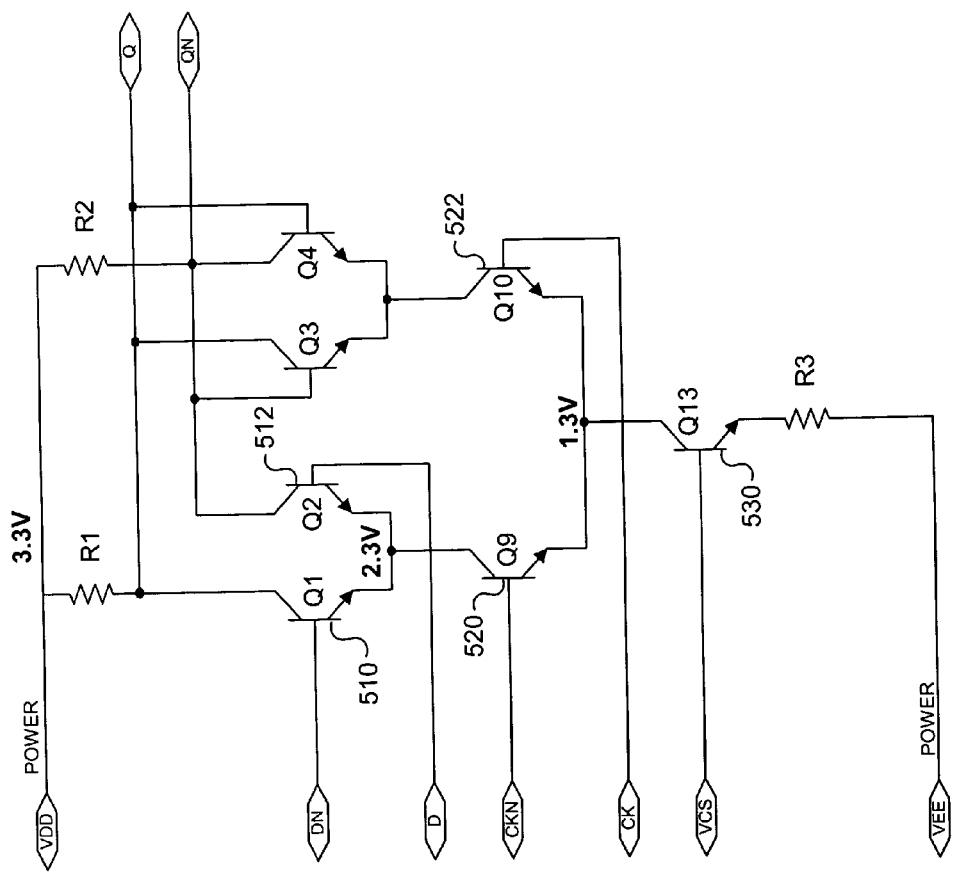
FIG. 5 is a schematic diagram of a related art bipolar latch circuit.
Figure 8A:
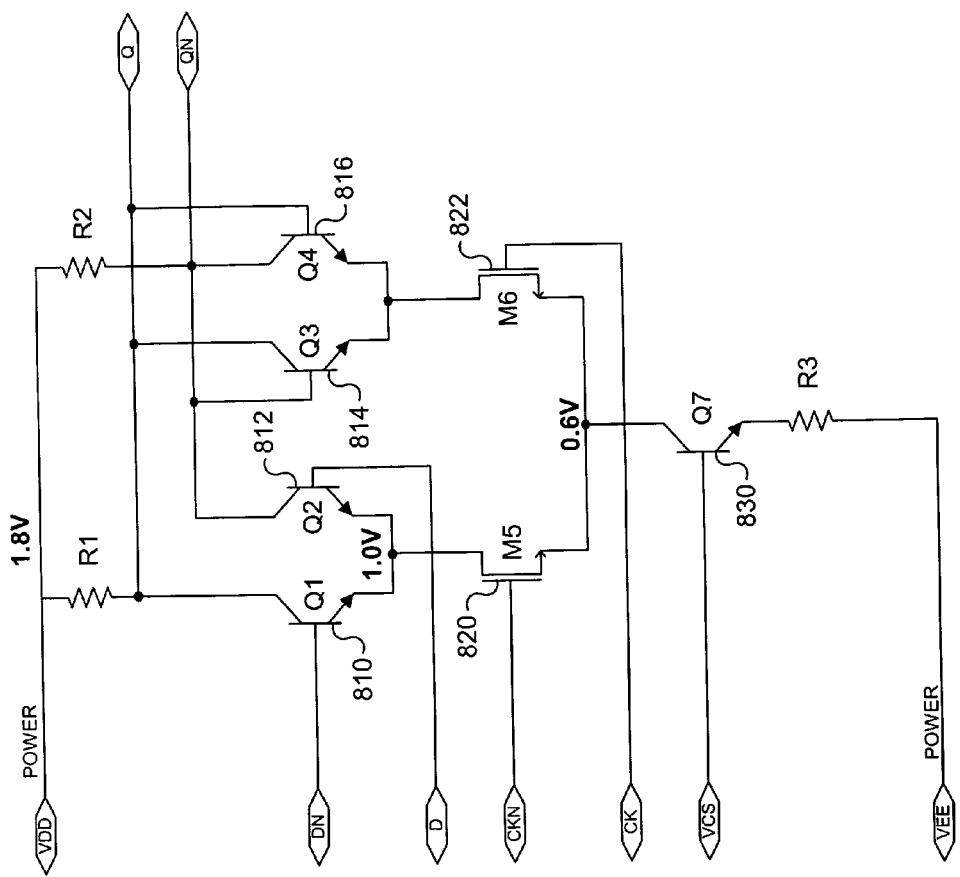
FIG. 8A is a schematic diagram of a BiCMOS latch circuit according to an embodiment of the present invention.

Referring to FIG. 8A, a schematic of a BiCMOS latch design according to an embodiment of the present invention is illustrated. When compared to the related art circuit of FIG. 5, those skilled in the art will appreciate that the function of the circuit is the same and therefore will not be described in detail herein. Bipolar transistors 810 and 812 form a differential input of the latch and are coupled to differential inputs D and DN. CMOS Transistors 820 and 822 are coupled to differential clock inputs CK and CKN. Transistor 830 is couple to a current source input VCS and functions as a current source for the latch.

A CMOS or bipolar transistor can be used interchangeably as the current source (see, e.g., FIG. 6). In principle, CMOS current sources require a smaller voltage drop. However, in high frequency circuits the DC voltage drop is essentially the same for bipolar or CMOS current sources. Therefore, the current source transistor in embodiments of the present invention can be either CMOS or bipolar transistors.

Accordingly, an embodiment of the present invention includes a BiCMOS integrated circuit, including a first differential pair of bipolar transistors 810 and 812 configured to drive a next stage (e.g., output Q/QN, and Q3/Q4). A second CMOS transistor 820 coupled to the first differential pair in a cascode configuration and third transistor 830 coupled to the second CMOS transistor. The third transistor is configured as a current source. As previously noted, the next stage can be a differential output Q, QN or subsequent internal stage having a differential input, e.g., as shown in FIG. 6.

The BiCMOS integrated circuit according to embodiments of the present invention can further include a second differential pair of bipolar transistors 814 and 816. A fourth CMOS transistor 822 coupled to a common node of the second differential pair of bipolar transistors 814 and 816 in a cascode configuration. The second transistor 820 and fourth transistor 822 are also configured in a differential configuration to receive the differential clock input CK and CKN. The third transistor 830 is coupled to a common node of the second 820 and fourth 822 transistor.

The bases of first differential pair of transistors 810 and 812 are coupled to a differential input signal D and DN, and the collectors are coupled to a differential output Q and QN. The bases of the second differential pair of transistors 814 and 816 are coupled to the differential output Q and QN, and the collectors are coupled to opposite lines of the differential output Q and QN. As illustrated, the base of transistor 814 is coupled to the collector of transistor 812, which also forms output QN and the base of transistor 816 is coupled to the collector of transistor 810, which also forms output Q. The gates of the transistor 820 and transistor 822 are coupled to a differential clock signal CK and CKN.

The voltage at the common node of transistor 820 and transistor 822 is approximately 0.6V. The voltage level is approximately 1.0V at the common node first differential pair of bipolar transistors 810 and 812. When compared to the voltage levels illustrated in the related art bipolar design, it is apparent that the voltages have been significantly reduced. Therefore, the power consumption has also been reduced and the circuit is able to operate on a nominal 1.8V power supply.

As discussed above, BiCMOS designs according to embodiments of the present invention can be applied to different BiGMOS processes. Comparisons of two specific processes were illustrated in Table 1 and Table 2. However, those skilled in the art will appreciate that the processes can be generally described by the cut-off frequency ($f_T$) for bipolar transistors and by gate length for CMOS transistors. Accordingly, embodiments of the present invention can achieve the performance illustrated in Table 1 when the bipolar transistors have an $f_T$ of 100–160 GHz and the CMOS transistors have a minimum gate length of 9 nm. Likewise, embodiments of the present invention can achieve the performance illustrated in Table 2, when the bipolar transistors have an $f_T$ of 50–70 GHz and the CMOS transistors have a minimum gate length of 0.25 µm. Those skilled in the art will appreciate that design considerations such as power consumption/performance tradeoffs for specific applications should be considered in determining the maximum $f_T$ of the bipolar transistors and sizing of the CMOS transistors.

As discussed in the foregoing description, the clocking transistors are typically CMOS transistors. However, CMOS transistors represent a high capacitive load for the driving stage. Therefore, to address the high capacitive load of the CMOS transistors, a bipolar level shifter stage with low output impedance can be included. Implementation of level shifters or buffer stages in a BiCMOS process are illustrated and discussed in the following description solely for purposes of illustration.

For a process with a low threshold voltage and short gate length a bipolar level-shifter can be used as a driver stage for the CMOS clock stage. In this case $V_{GS}$ can be kept small enough to allow for the voltage drop across $V_{be}$ associated with the level-shifter. At the same time the w/l ratio of the CMOS transistors can be increased without resulting in an excessive capacitance.

Figure 8B:
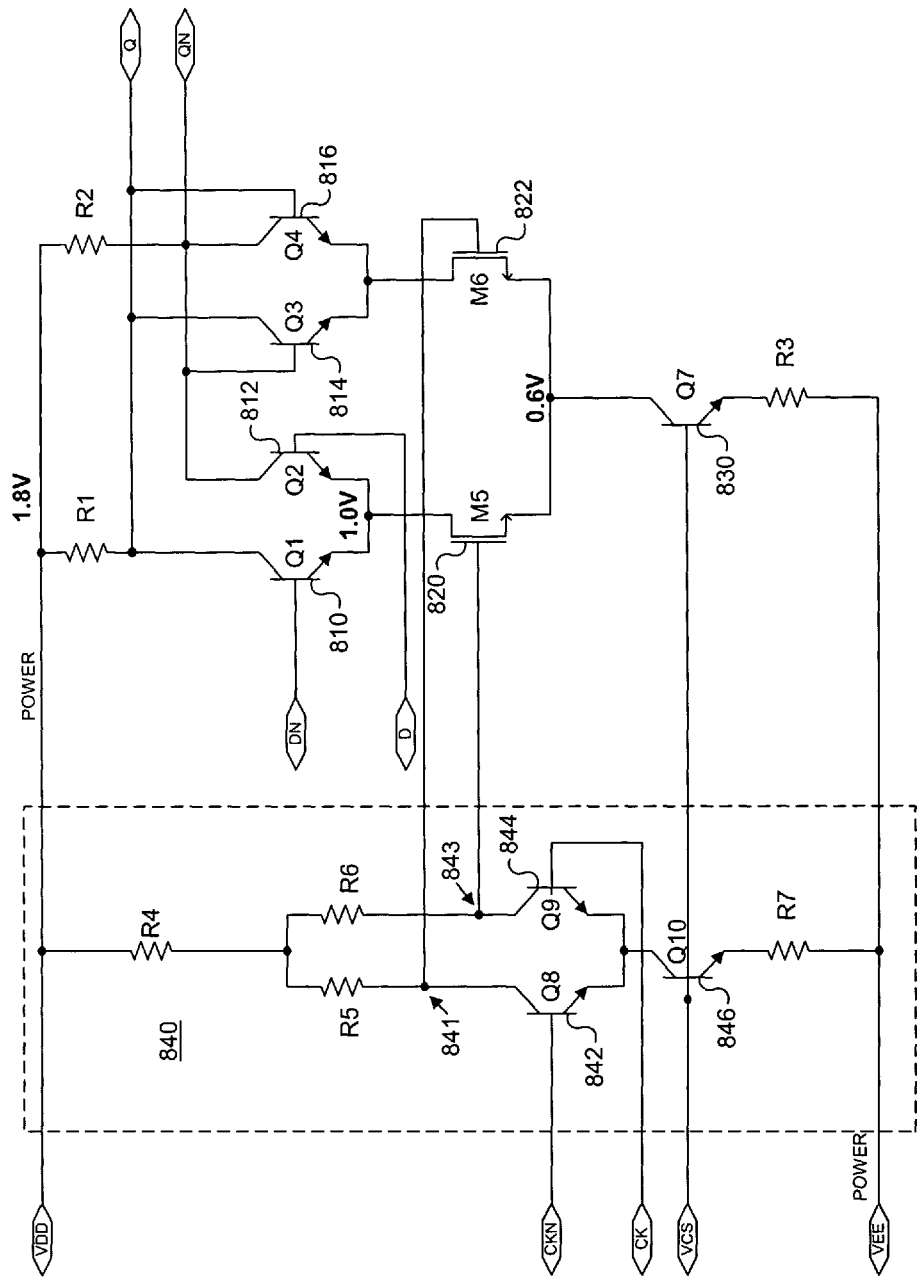
FIGS. 8B and 8C are schematic diagrams of a BiCMOS latch circuit including level shifters according to embodiments of the present invention.

FIG. 8B illustrates a level shifter stage 840 according to an embodiment of the present invention. Specifically, when bipolar transistor 842 is on (i.e., CKN is high) and current source transistor 846 is on, resistors R4 and R5 form a voltage divider with resistor R7 that results in node 841 being low. When bipolar transistor 842 is off (i.e., CKN is low), node 841 is high. Thus, input CKN is buffered and inverted at node 841. Likewise, when bipolar transistor 844 (i.e., CK is high) and current source transistor 846 are on, resistors R4 and R6 form a voltage divider with resistor R7 that results in node 843 being low. When bipolar transistor 844 is off (i.e., CK is low), node 843 is high. Thus, input CK is buffered and inverted at node 843. Nodes 841 and 843 are provided as the differential clock input to the latch circuit.

Figure 8C:
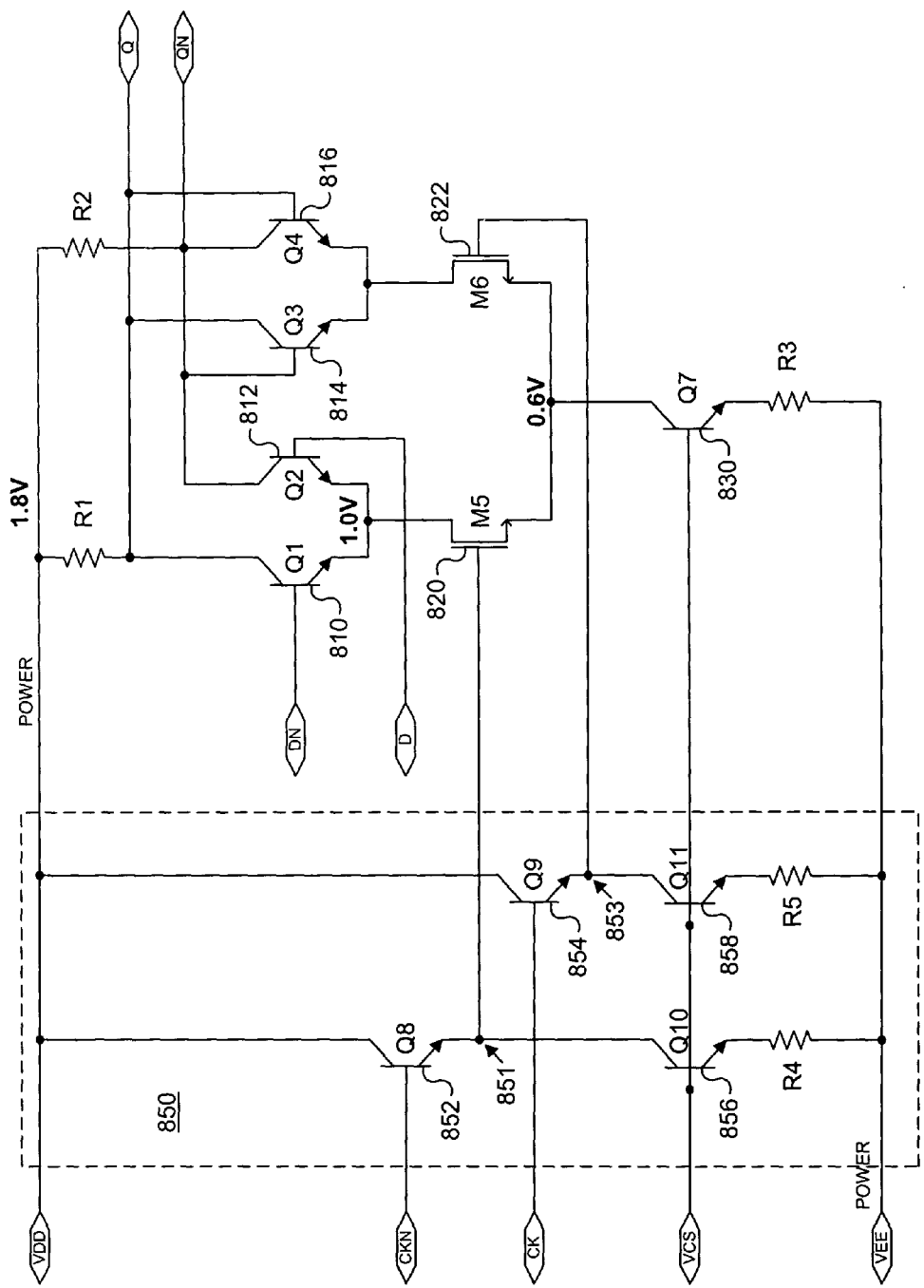

FIG. 8C illustrates a level shifter stage 850 according to another embodiment of the present invention. Specifically, when bipolar transistor 852 is on (i.e., CKN is high) and current source transistor 856 is on voltage VDD is dropped across resistor R4 and node 851 is high. When bipolar transistor 852 is off (i.e., CKN is low), node 851 is low. Thus, input CKN is buffered, but not inverted at node 851. Likewise, when bipolar transistor 854 (i.e., CK is high) and current source transistor 858 are on, node 853 is high. When bipolar transistor 854 is off (i.e., CK is low), node 853 is high. Thus, input CK is buffered, but not inverted at node 853. Nodes 851 and 853 are provided as the differential clock input to the latch circuit.

Those skilled in the art will appreciate that the foregoing description of the level shifters was sole for the purpose of illustration and limitation. Many alternative designs and variations of the components (e.g., transistors, resistors and the like) of the designs illustrated in FIGS. 8B and 8C will be apparent to those skilled in the art. For example in FIG. 8A, resistor R4 could be removed and resistors R5 and R6 could be coupled directly to the power supply.

The latch circuit illustrated in FIG. 8A can be used as a general building block for logic gates, as will be appreciated by those skilled in the art. Additionally, the latch circuit illustrated in FIG. 8A can be used in flip-flops as will be recognized from a review of FIG. 6 and other sequential circuits such as multiplexers, demultiplexers, clock and data recovery (CDR) circuits and the like.

Figure 9A:
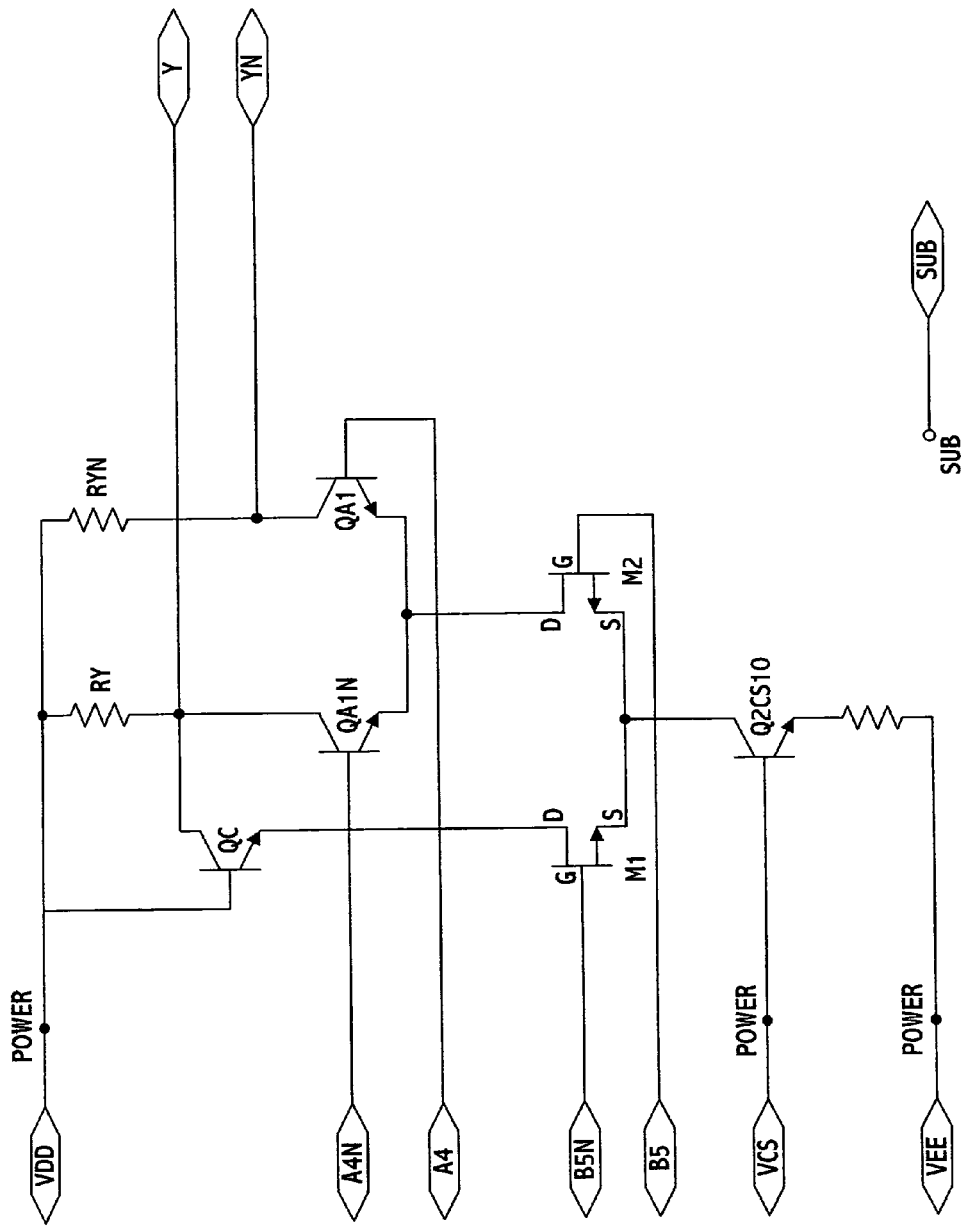
FIGS. 9A–D illustrate various BiCMOS logic circuits according to embodiments of the present invention.
Figure 9B:
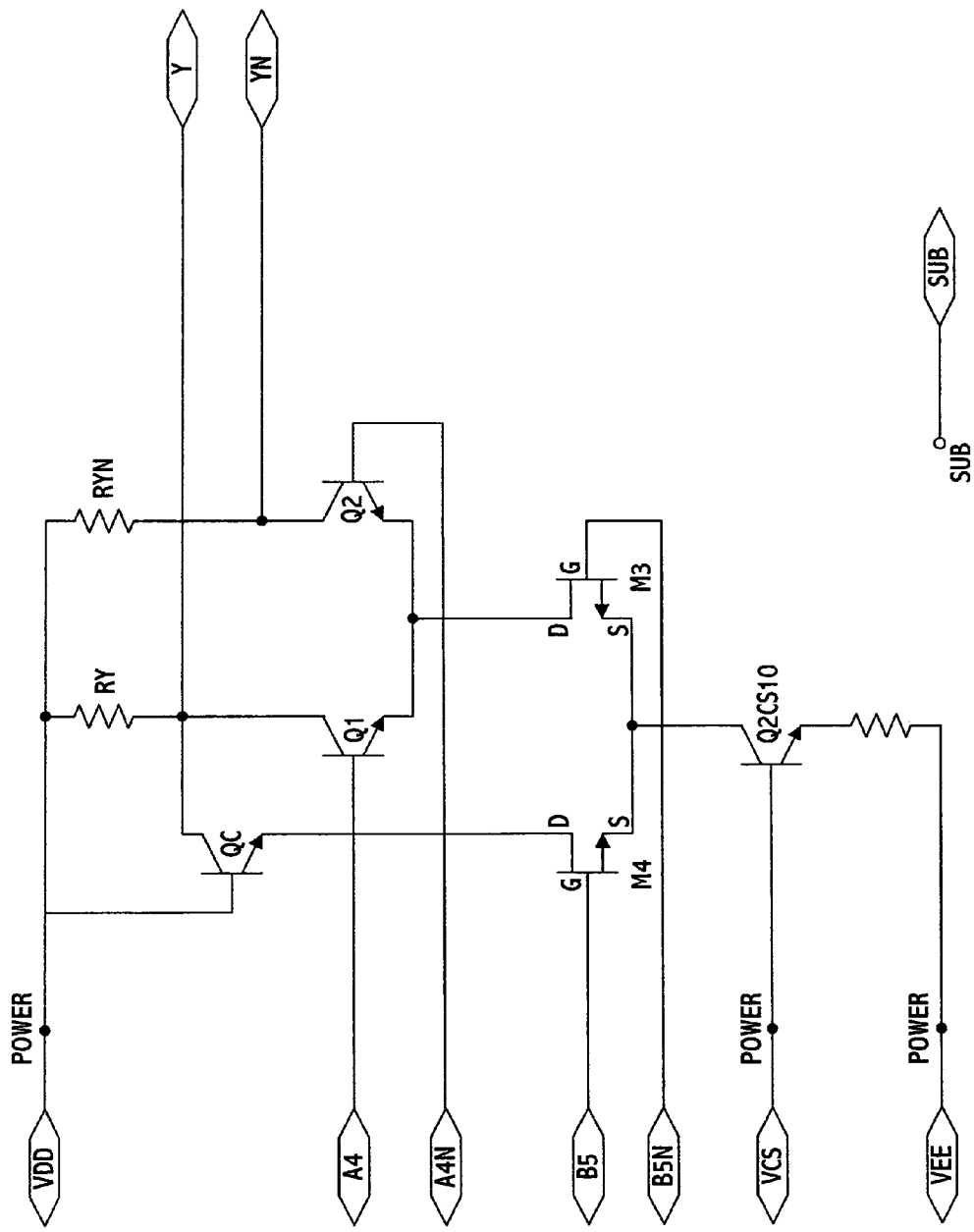
Figure 9C:
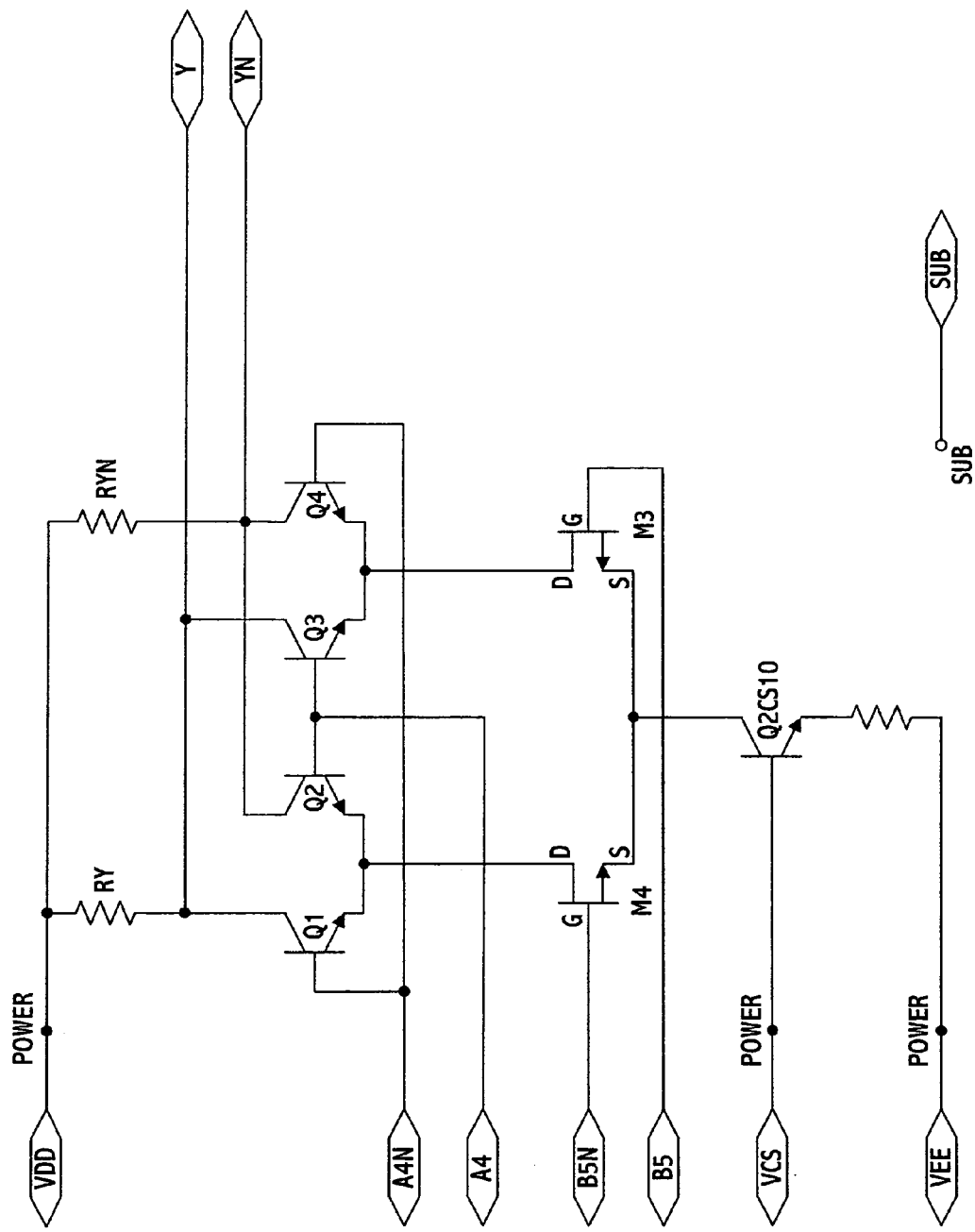
Figure 9D:
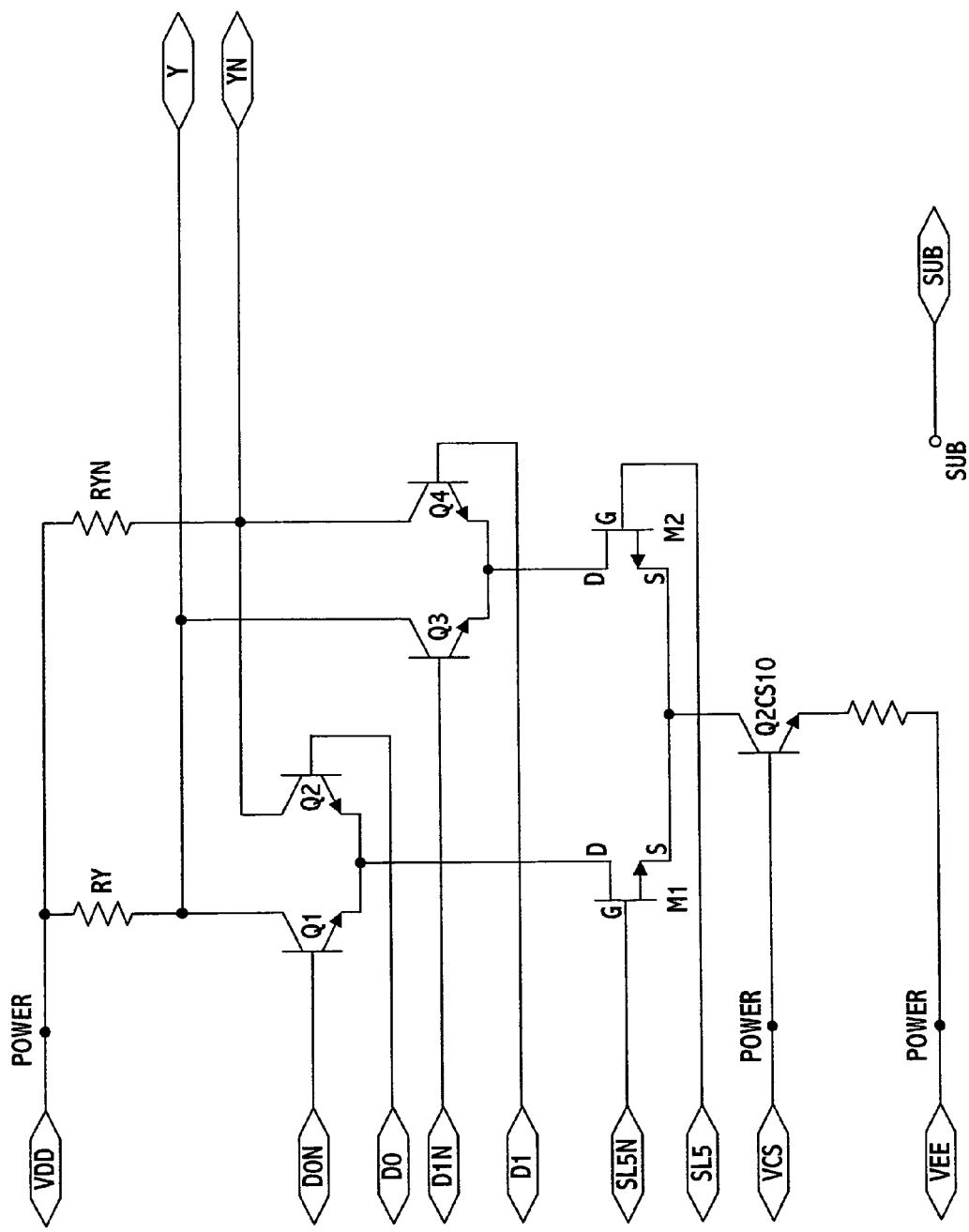

FIGS. 9A–D illustrate various BiCMOS logic circuits according to embodiments of the present invention, as mentioned above. Those skilled in the art will readily appreciate the function of each of these known circuits so detailed discussion of these circuits are recited herein. FIG. 9A is a schematic diagram of an AND gate according to an embodiment of the present invention. FIG. 9B is a schematic diagram of an OR gate according to an embodiment of the present invention. FIG. 9C is a schematic diagram of an XOR gate according to an embodiment of the present invention. FIG. 9D is a schematic diagram of an XOR gate according to an embodiment of the present invention. Those skilled in the art will appreciate that the level shifters illustrated in FIGS. 8B and 8C can be used with the logic gates to buffer inputs to the CMOS transistors. Additionally, the logic gates of FIGS. 9A–D are merely exemplary illustrations and other configurations of these gates and other gates will be apparent to those skilled in the art. For example, the current source transistors are illustrated as bipolar transistors, however, these transistors could also be CMOS as discussed in the foregoing description.

Accordingly, an embodiment of the present invention comprises an apparatus comprising a first bipolar stage, a second CMOS stage and a third stage. The first bipolar stage (e.g., Q1–Q4 of FIG. 8A; QC, QA1N, QA1 of FIG. 9A) is configured to receive an input (e.g., D, DN of FIG. 8A; A4N, A4 of FIG. 9A) and drive a subsequent stage (e.g., output Q, QN of FIG. 8A; Y, YN of FIG. 9A). The second CMOS stage (e.g., M5, M6 of FIG. 8A; M1, M2 of FIG. 9A) is coupled to the first bipolar stage in a series-gated configuration. The third stage (e.g., Q7 of FIG. 8A; Q2CS10 of FIG. 9A) is coupled to the second CMOS stage in a series-gated configuration and is configured to operate as a current source. The differential input to the second CMOS stage can be a clock input (e.g., CK, CKN of FIG. 8A) and or a data input (e.g., B5, B5N of FIG. 9A). Therefore, as discussed in the foregoing description BiCMOS designs including a first bipolar stage, second CMOS stage and third stage according to embodiments of the present invention can be used to design various circuits, such as a latch, flip-flop, inverter, logic gates (e.g., AND, OR, XOR, NAND, NOR), serializer, deserializer, clock and data recovery (CDR) and the like.

Figure 10A:
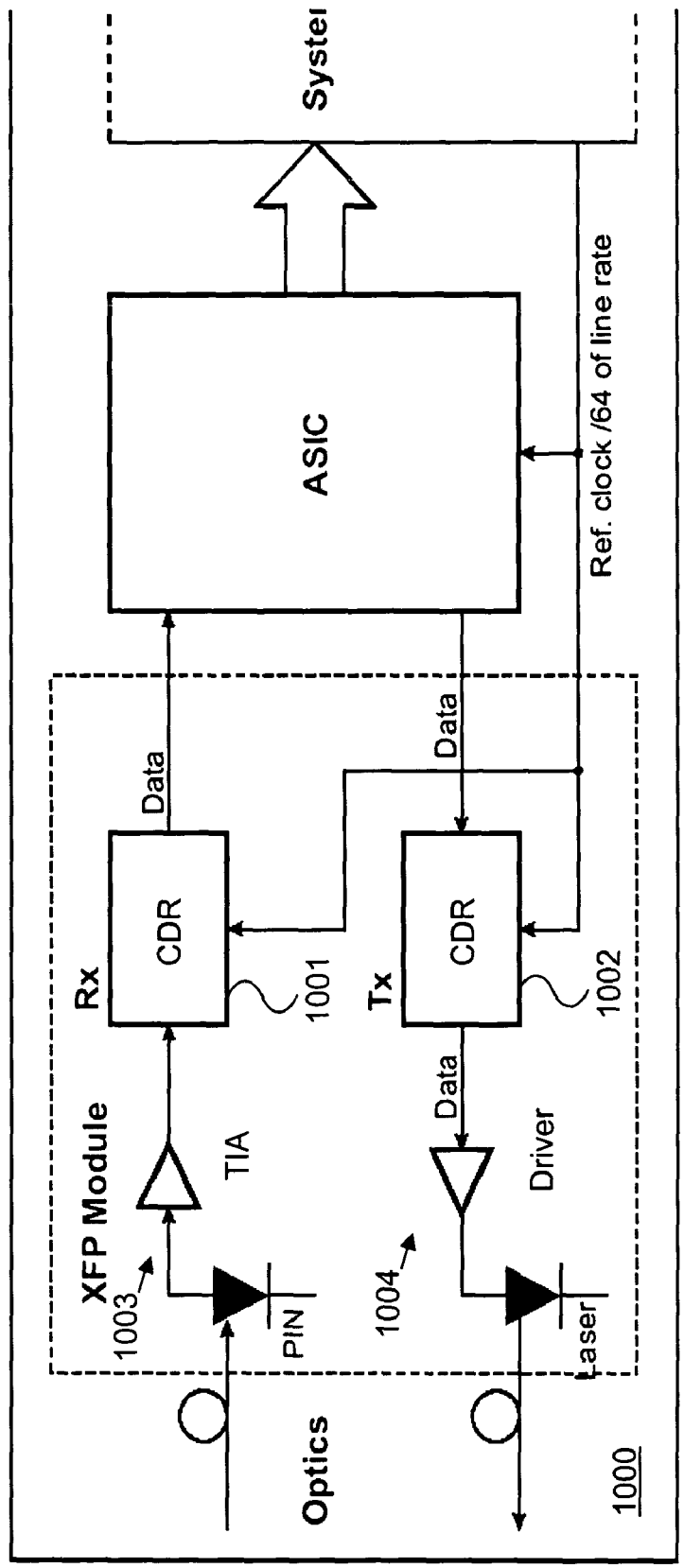
FIGS. 10A–C illustrate an optical network device and related circuits according to embodiments of the present invention.

FIGS. 10A illustrates a block diagram of a network device including a CDR according to an embodiment of the present invention. The optical network device 1000 illustrated (e.g., 10 Gbps optical receiver) can provide an interface between the photonic physical layer and the electrical section layer in a high-speed communications network. The optical network device 1000 includes a CDR 1001 used in the receive section 1003 and a CDR 1002 used in the transmitter section 1004. The receiver section 1003 converts an optical signal to a serial electrical signal. The receiver section 1003 includes a photodiode PIN, transimpedance amplifier TIA, and CDR 1001. The transmitter section 1004 cleans up and re-times the input from a serial data bus and converts the result to an optical signal using a laser. The transmitter section 1004 includes CDR 1002, a driver, and laser. These components and the operation of the system is known to those skilled in the art, so further details will not be provided regarding the components or system.

Figure 10B:
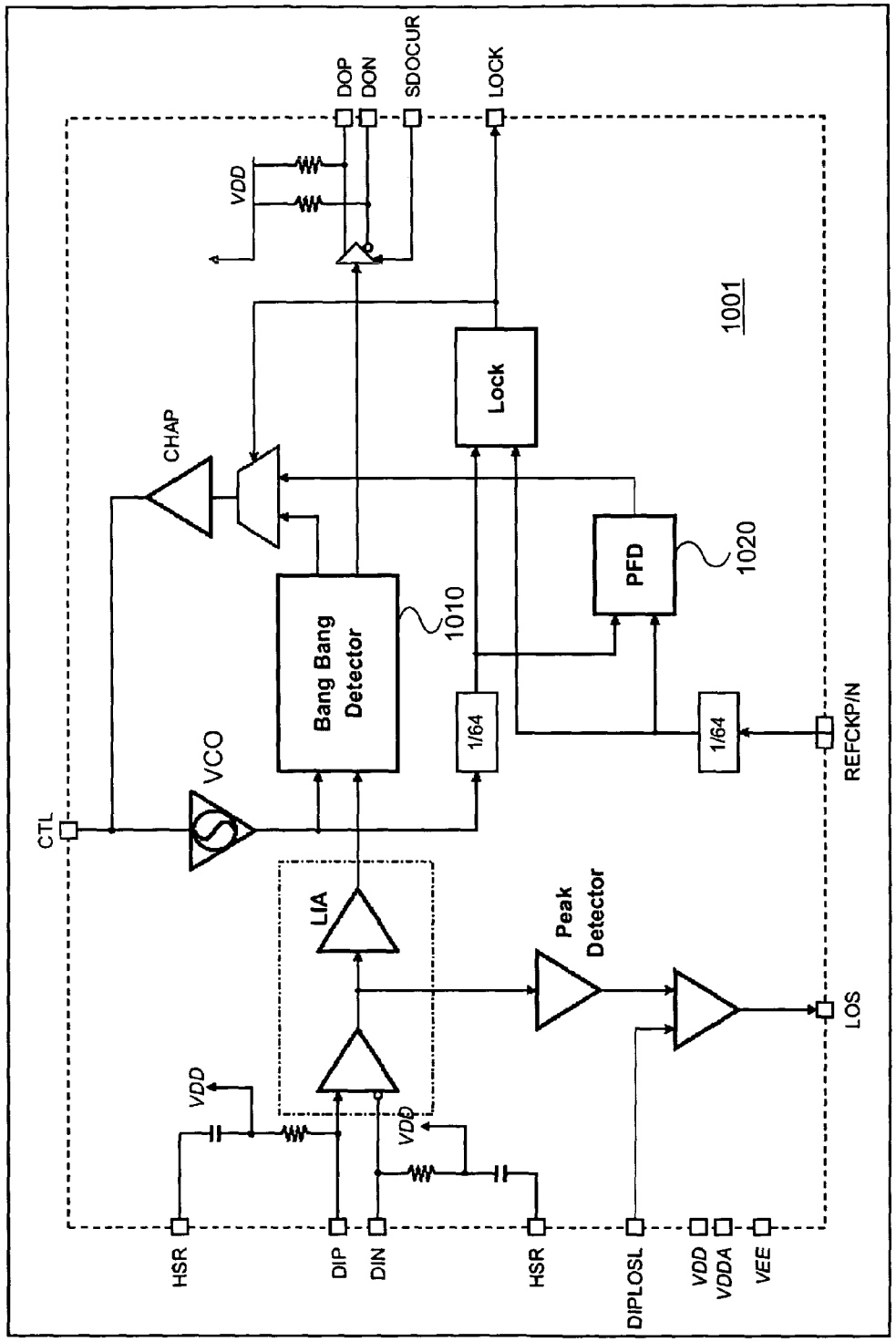

FIG. 10B illustrates a block diagram of a 1:1 CDR according to an exemplary embodiment of the present invention. As noted above, the CDR 1001 can be used as part of a high-speed network device. The CDR 1001 can include a bang bang detector 1010, phase frequency detector (PFD) 1020, voltage controlled oscillator VCO, limit amplifier LIA, charge pump CHAP, peak detector, lock circuit, and other components as illustrated and known in the art. Further, BiCMOS circuits described in the foregoing description can be used in the CDR 1001 to achieve a low power high-speed design. For example, the bang bang phase detector 1010 and PFD 1020 can include BiCMOS circuits (e.g., latches, flip-flops, logic circuits, and multiplexers).

Figure 10C:
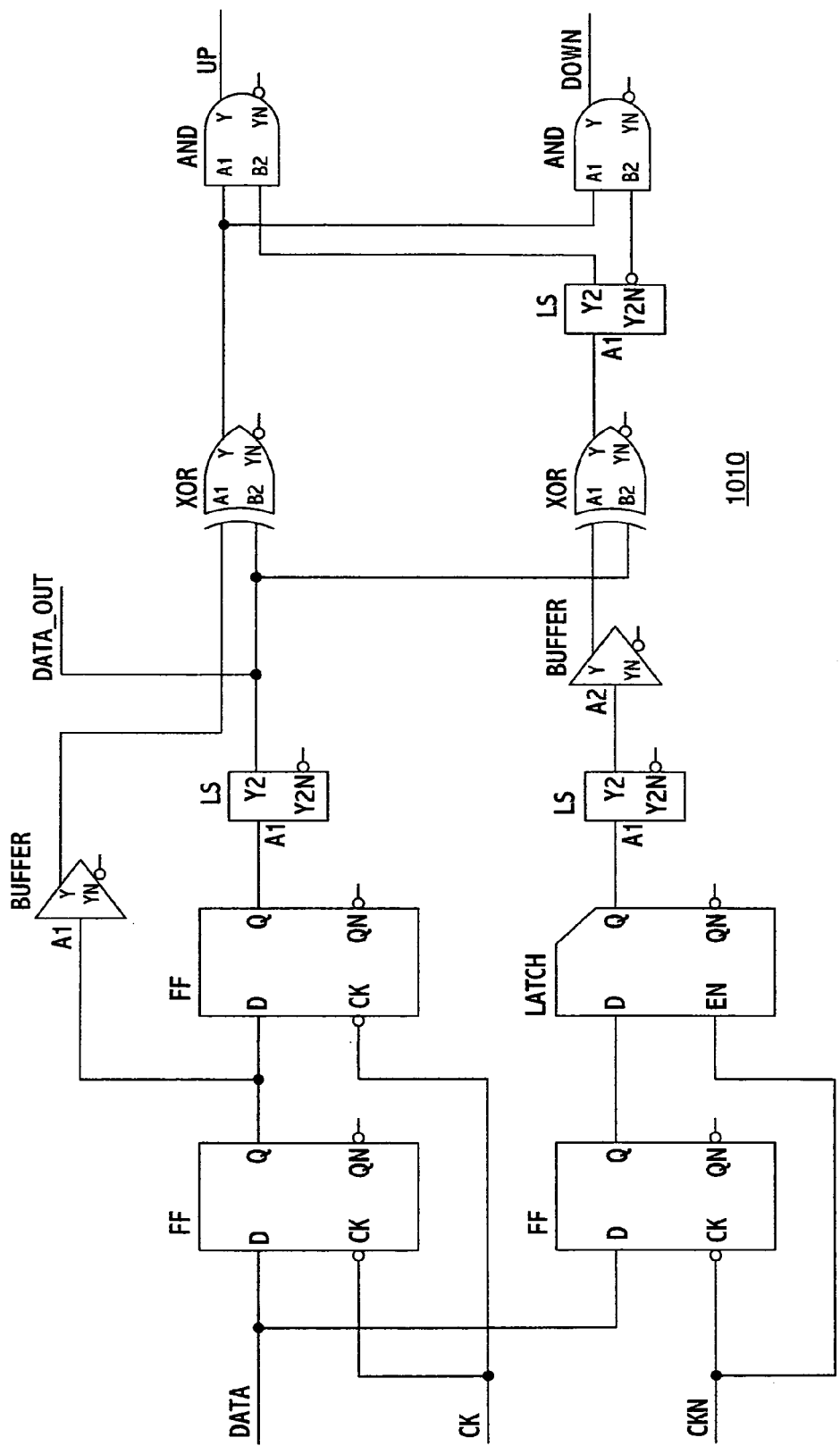

FIG. 10C illustrates a block diagram of an exemplary bang bang phase detector 1010. As can be seen from FIG. 10C, the flip-flop, latch and logic circuits that comprise the bang bang phase detector can be implemented in BiCMOS according to embodiments of the present invention detailed in the foregoing description. Likewise, those skilled in the art will appreciate that BiCMOS circuits according to embodiments can be used to implement other components of the CDR (e.g., PFD 1020).

Accordingly, those skilled in the art will appreciate that the network devices illustrated in FIGS. 10A–C are further embodiments of the present invention comprising a variety of individual BiCMOS circuits. For example, an embodiment of the present invention can include a network device comprising a clock and data recovery (CDR). The CDR includes a bang bang circuit and the bang bang circuit includes at least one BiCMOS circuit (e.g., as described above including a first bipolar stage, second CMOS stage, and third stage).

Figure 11:
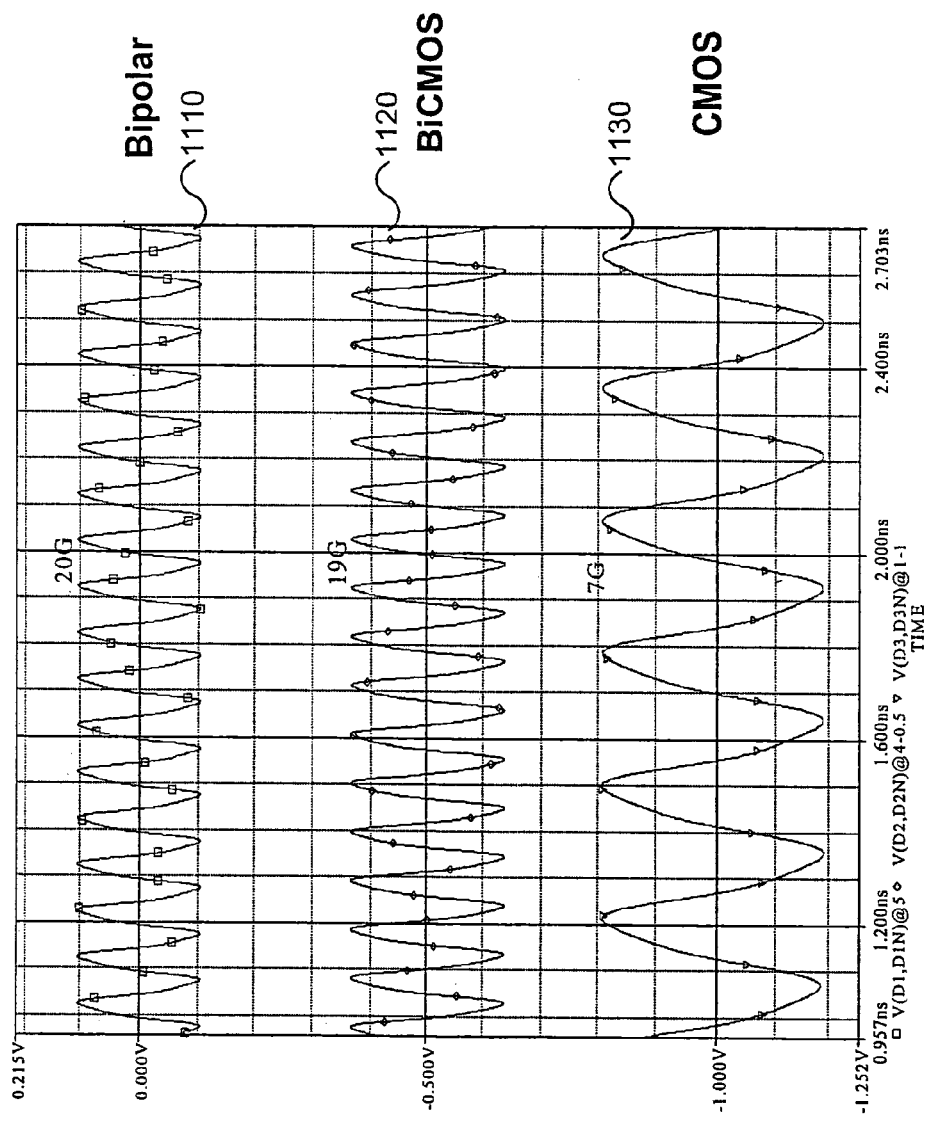
FIG. 11 illustrates a comparison of bipolar, CMOS and BiCMOS toggle flip-flop designs.

FIG. 11 illustrates a comparison of output waveforms of a related art bipolar design, a related art CMOS design and a BiCMOS design according to embodiments of the present invention. Waveform 1120 illustrates the output of a BiG-MOS toggle flip-flop operating at an input frequency of approximately 19 GHz. Waveform 1110 illustrates the output of a bipolar toggle flip-flop operating at 20 GHz. Waveform 1130 illustrates the output of a bipolar toggle flip-flop operating at 7 GHz. These waveforms represent the maximum frequency for a given process. These simulations were performed for the BiGMOS process. As can be appreciated from the waveforms, the voltage swings in both the bipolar and BiCMOS circuits are less than 0.3, and are slightly lower in the bipolar design. The voltage swing is close to the DC voltage of 250 mV indicating that reliable toggle operation can be achieved at these frequencies. Regarding the CMOS waveform 1130, it is apparent the voltage swing is substantially larger than both the bipolar and BiCMOS designs and the frequency is substantially lower.

Figure 12:
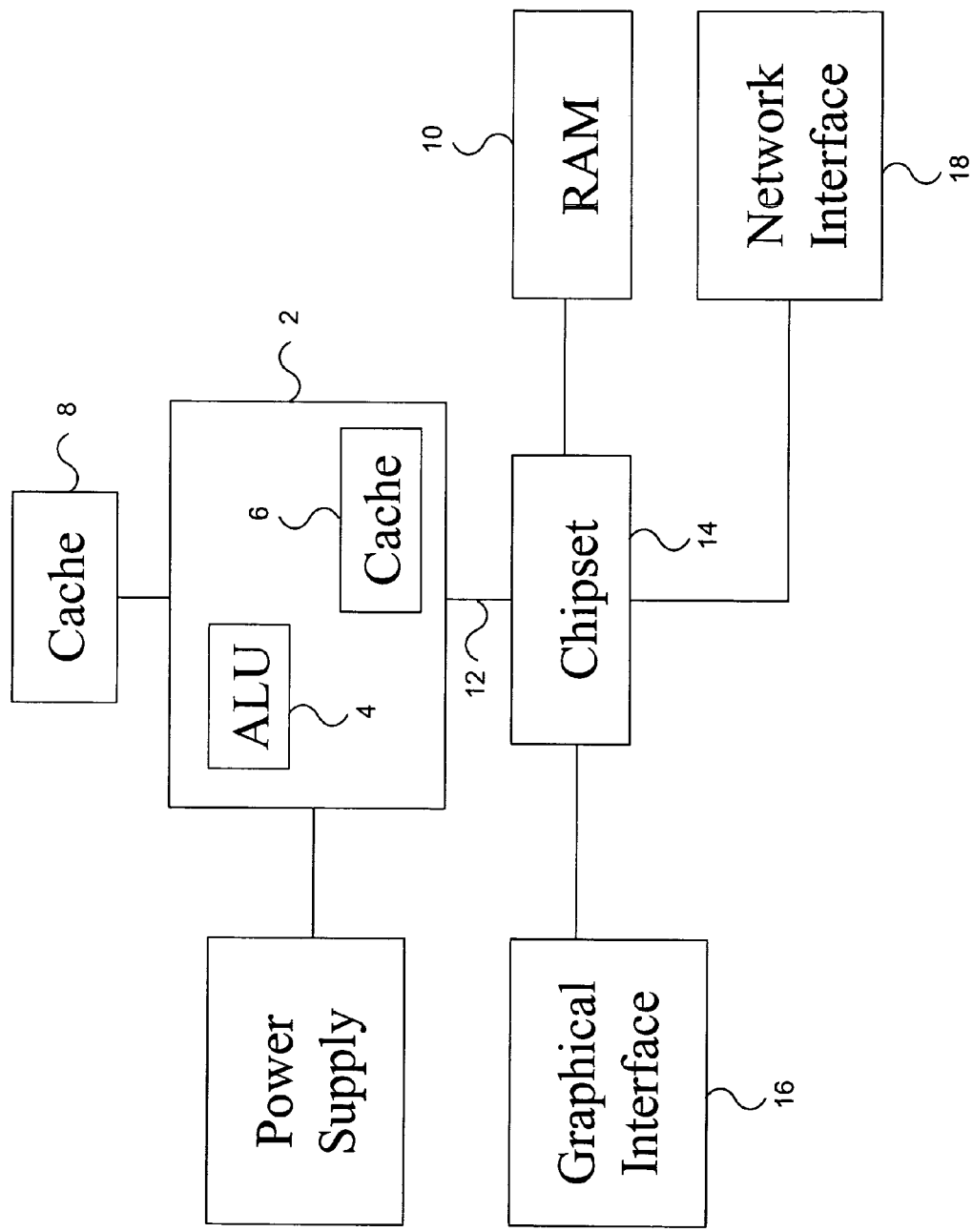
FIG. 12 illustrates a system level block diagram of a computer system according to an embodiment of the present invention.

Embodiments of the present invention relate to lower power high-speed design improvements in BiCMOS processes for use in a wide variety of applications including computer systems. FIG. 12 shows an exemplary illustration of a computer system. The computer system can include a microprocessor 2, which can include many sub-blocks such as an arithmetic logic unit (ALU) 4 and an on-die cache 6. The microprocessor 2 may also communicate to other levels of cache, such as off-die cache 8. Higher memory hierarchy levels such as system memory 10 are accessed via host bus 12 and a chip set 14. In addition, other off-die functional units such as a graphics accelerator 16 and a network interface 18, to name just a few, may communicate with the microprocessor 2 via appropriate busses or ports.

Accordingly, network interface 18 can include a network device such as illustrated in FIGS. 10A–C. Further, those skilled in the art will appreciate that any high data-rate networks, for example, 10 G Ethernet or high data-rate connections in computer clusters, can comprise embodiments of the present invention. Therefore, a further embodiment of the present invention can include a computer system comprising: a microprocessor 2 and an off-die component in communication with the microprocessor 2. The off-die component can be a network interface 18 comprising at least one circuit (e.g., CDR, latch, flip-flop, logic gate) including a first bipolar stage, second CMOS stage, and third stage, as detailed in foregoing description.

The foregoing embodiments and descriptions are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An integrated circuit, comprising:
a first differential pair of bipolar transistors to drive a next stage;
a second differential pair of bipolar transistors;
a first CMOS transistor coupled to the first differential pair in a cascode configuration;
a second CMOS transistor coupled to the second differential pair, the first CMOS transistor to receive a first clock signal and the second CMOS transistor to receive a second clock signal, the second clock signal being a differential of the first clock signal; and
a third transistor coupled to the first CMOS transistor and the second CMOS transistor, the third transistor configured as a current source.

2. The integrated circuit of claim 1, wherein a supply voltage of the integrated circuit is nominally 1.8V.

3. The integrated circuit of claim 1, wherein the third transistor is at least one of a CMOS transistor and a bipolar transistor.

4. The integrated circuit of claim 1, wherein the first CMOS transistor and the second CMOS transistor are arranged in a differential configuration, and the third transistor is coupled to the second CMOS transistor and the first CMOS transistor at a common node.

5. The integrated circuit of claim 4, wherein bases of the first differential pair of transistors are coupled to a differential input signal and collectors of the first differential pair of transistors are coupled to a differential output,
bases of the second differential pair of transistors are coupled to the differential output and corresponding collectors of the second differential pair of transistors are coupled to opposite sides of the differential output, and
gates of the first CMOS transistor and the second CMOS transistor are coupled to receive differential clock signals.

6. The integrated circuit of claim 1, wherein the integrated circuit is at least one of a latch circuit, a flip-flop circuit, an inverter circuit, a logic gate circuit, a serializer circuit, a deserializer circuit and a clock circuit and data recovery (CDR) circuit.

7. The integrated circuit of claim 1, wherein the bipolar transistors have a cut-off frequency ($f_T$) of about 100–160 GHz and the CMOS transistors have a minimum gate length of 90 nm.

8. The integrated circuit of claim 1, wherein the integrated circuit is at least one of an AND circuit, an OR circuit, an XOR circuit, a NAND circuit, a NOR circuit, and a MUX circuit.

9. The integrated circuit of claim 1, further comprising a level shifter coupled to the first CMOS transistor.

10. The integrated circuit of claim 9, wherein the level shifter comprises:
a resistor coupled to a power supply; and
a bipolar transistor having a collector coupled to the resistor, an emitter coupled to a current source transistor, and a base coupled to an input, and an input of the first CMOS transistor is coupled to a connection node of the resistor and the bipolar transistor.

11. The integrated circuit of claim 10, wherein the current source transistor is one of a bipolar transistor and a CMOS transistor.

12. The integrated circuit of claim 9, wherein the level shifter comprises:
a bipolar transistor having a collector coupled to a power supply, an emitter coupled to a current source transistor, and a base coupled to an input, and an input of the first CMOS transistor is coupled to a connection node of the bipolar transistor and the current source transistor.

13. The integrated circuit of claim 12, wherein the level shifter current source transistor is one of a bipolar transistor and a CMOS transistor.

14. The integrated circuit of claim 1, wherein a width/length (w/l) ratio of the first CMOS transistor is one of about 50 and about 20.

15. An apparatus comprising:
a first bipolar stage to receive an input and drive a subsequent stage;
a second CMOS stage coupled to the first bipolar stage in a series-gated configuration, the second CMOS stage including a first CMOS transistor to receive a first clock signal and a second CMOS transistor to receive a second clock signal, the first and second clock signals being a differential pair; and a third stage coupled to the second CMOS stage in a series-gated configuration, the third stage to operate as a current source.

16. The apparatus of claim 15, wherein the first bipolar stage comprises a plurality of bipolar transistors to receive a first differential input and drive a differential output.

17. The apparatus of claim 16, wherein the first differential input comprises a data input.

18. The apparatus of claim 15, wherein a supply voltage of the apparatus is nominally 1.8V.

19. The apparatus of claim 15, wherein the apparatus is at least one of a latch circuit, a flip-flop circuit, an inverter circuit, a logic gate circuit, a serializer circuit, a deserializer circuit, a clock and data recovery (CDR) circuit, an AND circuit, an OR circuit, an XOR circuit, a NAND circuit, a NOR circuit, and a MUX circuit.

20. The apparatus of claim 15, wherein transistors in the bipolar stage have a cut-off frequency ($f_T$) of about 100–160 GHz and transistors in the CMOS stage have a minimum gate length of about 90 nm.

21. The apparatus of claim 15, wherein a width/length (w/l) ratio of transistors of the CMOS stage is one of about 50 and about 20.

22. The apparatus of claim 15, further comprising a level shifter coupled to the CMOS stage, the level shifter to buffer the differential pair of clock inputs.

23. The apparatus of claim 15, wherein the apparatus is a network device.

24. The apparatus of claim 23, wherein the network device comprises a clock and data recovery (CDR) circuit comprising a bang bang circuit, and the bang bang circuit comprises the first bipolar stage, the second CMOS stage, and the third stage.

25. The apparatus of claim 23, wherein the network device is an optical network device.

26. The apparatus of claim 25, further comprising:
a photodiode coupled to an optical input;
a transimpedance amplifier coupled to the photodiode; and
a clock and data recovery (CDR) circuit coupled to the transimpedance amplifier, the CDR circuit comprising at least one circuit including the first bipolar stage, the second CMOS stage, and the third stage.

27. The apparatus of claim 15, wherein the apparatus is a computer system comprising:
a microprocessor; and
an off-die component in communication with the microprocessor, the off-die component being a network interface comprising at least one circuit including the first bipolar stage, the second CMOS stage, and the third stage.

28. A BiCMOS latch comprising:
a first transistor and a second transistor configured as a differential pair coupled to a differential input and to a differential output, and the first and second transistors are bipolar transistors;
a third transistor and a fourth transistor configured as a differential pair having bases and collectors coupled to opposite sides of the differential output, and the third and fourth transistors are bipolar transistors;
a fifth transistor to receive a first clock input and a sixth transistor to receive a second clock input, the first and second clock inputs being a differential pair, the fifth and sixth transistors are CMOS transistors, the fifth transistor is coupled to the first and second transistors and the sixth transistor is coupled to the third and fourth transistors in a series-gated configuration; and
a seventh transistor coupled to the fifth and sixth transistors, and the seventh transistor to operate as a current source.

29. The BiCMOS latch of claim 28, further comprising a level shifter coupled to the fifth and sixth transistors, the level shifter to buffer the differential pair of clock inputs.

30. An integrated circuit, comprising:
a first differential pair of bipolar transistors to drive a next stage; a second transistor coupled to the first differential pair in a cascode configuration, the second transistor comprising a CMOS transistor;
a third transistor coupled to the second transistor, the third transistor configured as a current source; and
a level shifter coupled to the second transistor.

31. The integrated circuit of claim 30, wherein the level shifter comprises:
a resistor coupled to a power supply; and
a bipolar transistor having a collector coupled to the resistor, an emitter coupled to a current source transistor, and a base coupled to an input, and an input of the second transistor coupled to a connection node of the resistor and the bipolar transistor.

32. The integiated circuit of claim 30, wherein the level shifter comprises:
a bipolar transistor having a collector coupled to a power supply, an emitter coupled to a current source transistor, and a base coupled to an input, and an input of the second transistor coupled to a connection node of the bipolar transistor and the current source transistor.

33. An apparatus comprising:
a first differential pair of bipolar transistors to drive a next stage;
a second CMOS stage coupled to the first bipolar stage in a series-gated configuration;
a third stage coupled to the second CMOS stage in a series-gated configuration, and the third stage to operate as a current source; and
a level shifter coupled to the second CMOS stage, and the level shifter to buffer a differential pair of clock inputs.

34. The apparatus of claim 33, wherein the level shifter comprises:
a resistor coupled to a power supply; and
a bipolar transistor having a collector coupled to the resistor, an emitter coupled to a current source transistor, and a base coupled to an input, and an input of a transistor of the second CMOS stage coupled to a connection node of the resistor and the bipolar transistor.

35. The apparatus of claim 33, wherein the level shifter comprises:
a bipolar transistor having a collector coupled to a power supply, an emitter coupled to a current source transistor, and a base coupled to an input, and an input of a transistor of the second CMOS stage coupled to a connection node of the bipolar transistor and the current source transistor.

* * * * *